US007015150B2

(12) United States Patent
Cooney, III et al.

(10) Patent No.: US 7,015,150 B2
(45) Date of Patent: Mar. 21, 2006

(54) EXPOSED PORE SEALING POST PATTERNING

(75) Inventors: Edward C. Cooney, III, Jericho, VT (US); John A. Fitzsimmons, Poughkeepsie, NY (US); Jeffrey P. Gambino, Westford, VT (US); Stephen E. Luce, Underhill, VT (US); Thomas L. McDevitt, Underhill, VT (US); Lee M. Nicholson, Katonah, NY (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/709,747

(22) Filed: May 26, 2004

(65) Prior Publication Data

US 2005/0266698 A1    Dec. 1, 2005

(51) Int. Cl.
    *H01L 21/31*    (2006.01)
    *H01L 21/302*   (2006.01)
(52) U.S. Cl. .................... 438/765; 438/622; 438/637; 438/638; 438/758; 438/770
(58) Field of Classification Search ........... 438/765, 438/770, 775, 758, 622, 637
    See application file for complete search history.

(56) References Cited

U.S. PATENT DOCUMENTS

| | | | |
|---|---|---|---|
| 5,847,443 A | 12/1998 | Cho et al. | |
| 6,008,540 A | 12/1999 | Lu et al. | |
| 6,063,714 A | 5/2000 | Smith et al. | |
| 6,140,252 A | 10/2000 | Cho et al. | |
| 6,156,651 A | 12/2000 | Havemann | |
| 6,351,039 B1 | 2/2002 | Jin et al. | |
| 6,380,075 B1 | 4/2002 | Cabral, Jr. et al. | |
| 6,391,795 B1 | 5/2002 | Catabay et al. | |
| 6,482,733 B1 | 11/2002 | Raaijmakers et al. | |
| 6,489,233 B1 | 12/2002 | Chooi et al. | |
| 6,495,447 B1 | 12/2002 | Okada et al. | |
| 6,528,409 B1 | 3/2003 | Lopatin et al. | |
| 6,534,387 B1 | 3/2003 | Shinogi et al. | |
| 6,537,896 B1 * | 3/2003 | Catabay et al. | 438/474 |
| 6,541,842 B1 | 4/2003 | Meynen et al. | |
| 6,548,348 B1 * | 4/2003 | Ni et al. | 438/253 |
| 6,566,283 B1 | 5/2003 | Pangrle et al. | |
| 6,583,046 B1 | 6/2003 | Okada et al. | |

(Continued)

*Primary Examiner*—Michael Trinh
(74) *Attorney, Agent, or Firm*—DeLio & Peterson, LLC; Kelly M. Nowak; Lisa U. Jaklitsch

(57) ABSTRACT

Methods and structures having pore-closing layers for closing exposed pores in a patterned porous low-k dielectric layer, and optionally a reactive liner on the low-k dielectric. A first reactant is absorbed or retained in exposed pores in the patterned dielectric layer and then a second reactant is introduced into openings such that it enters the exposed pores, while first reactant molecules are simultaneously being outgassed. The second reactant reacts in-situ with the outgassed first reactant molecules at a mouth region of the exposed pores to form the pore-closing layer across the mouth region of exposed pores, while retaining a portion of each pore's porosity to maintain characteristics and properties of the porous low-k dielectric layer. Optionally, the first reactant may be adsorbed onto the low-k dielectric such that upon introduction of the second reactant into the patterned dielectric openings, a reactive liner is also formed on the low-k dielectric.

18 Claims, 10 Drawing Sheets

U.S. PATENT DOCUMENTS

| | | |
|---|---|---|
| 2002/0117754 A1 | 8/2002 | Gates et al. |
| 2004/0175935 A1 * | 9/2004 | Abell ......................... 438/638 |
| 2005/0127515 A1 * | 6/2005 | Knorr et al. ................. 257/762 |
| 2005/0148202 A1 * | 7/2005 | Heiliger et al. ............. 438/778 |

* cited by examiner

EXPOSED PORE SEALING POST PATTERNING

BACKGROUND OF INVENTION

The present invention relates to semiconductor devices and, in particular, to structures and methods for closing exposed pores in a patterned low-k dielectric prior to metallization.

Because of continuing decreases in sizes of integrated circuits (IC) and circuit components in semiconductor chips, there are a number of interconnect wiring challenges facing the technical community over the next few technology generations. Among these challenges include the electrically conductive interconnects being placed closer together vertically, as well as reduction of the horizontal spacing between the electrically conductive interconnects. However, both of these features of smaller ICs result in an undesirable increase in capacitance between conductive portions of the IC, which in turn, results in loss of speed of the IC and increased cross-talk.

In addressing the above problems, prior art has focused on replacing conventional $SiO_2$ dielectric materials typically having a dielectric constant (k) of about 4.0. Lower dielectric constant materials have replaced the conventional materials, and thereby have lowered the overall interconnect capacitance of the IC. One such avenue pursued to lower interconnect capacitance has been the use of low-k dielectrics. These low-k dielectrics tend to have a dielectric constant (k) of about 3.0 or less. The prior art is replete with various low-k dielectric materials and methods of forming the same over a substrate for lowering the interconnect capacitance.

However, as ICs have become smaller and faster, the need to reduce the interconnect capacitance even further has persisted. One technique introduced in the art is to provide low-k dielectric materials with porosity for a further reduction in interconnect capacitance. By adding porosity to a low-k dielectric material, the dielectric constant (k) can be decreased down to about 2.0, or even less.

Generally, a porous low-k dielectric layer is formed on an integrated circuit structure by depositing a low-k dielectric material in combination with an extractable material, such as a porogen. During such fabrication process, the porogen is removed from the low-k dielectric material, thereby leaving a number of pores having a variety of shapes and sizes residing throughout the low-k dielectric layer. Numerous porous low-k dielectric materials, and methods of making the same, exist in the art.

Once the porous low-k dielectric layers are fabricated, IC fabrication continues by patterning and etching openings into the porous low-k dielectric layers. These openings commonly include damascene and/or dual damascene vias and/or trenches that are subsequently filled with metallization, such as copper fill. However, as a result of etching openings into the porous low-k dielectric layer, one or more of the pores residing throughout the porous layer are exposed. These exposed pores may reside on a planar surface of the porous layer and/or within the via/trench openings. Exposed pores are undesirable as they can create voids on the planar surface and in the via/trench openings, which when subsequently filled with metallization, can degrade the deposited metallurgy and even lead to shorting between adjacent metal-filled vias and trenches.

To overcome these problems associated with exposed pores, prior art has focused on sealing, blocking or closing exposed pores of a porous low-k dielectric layer. Conventional approaches include depositing a liner layer over exposed planar surfaces of the porous low-k dielectric layer and/or within via/trench openings to close exposed pores therein. For example, prior art is directed to forming a barrier liner layer, such as tantalum metal, over exposed surfaces of the via/trench openings to both cover these surfaces and close any exposed pores within such openings. Conductive metallurgy, such as copper, subsequently fills the remaining empty portions of the via/trench openings.

However, providing a barrier liner layer over exposed surfaces, and hence any exposed pores, within the via/trench openings is often inadequate. For instance, the deposited barrier layer may not completely fill the exposed pores within the via/trench openings, such that when metallurgy is subsequently deposited, it too may not completely fill remaining portions of the exposed pores. This results in voids in the deposited metallurgy, which leads to high resistance of metallurgy at the location of such void(s) and degradation of the deposited metallurgy.

Alternatively, or in addition to the above, wherein the barrier liner layer does not completely cover surfaces within the void, i.e., a portion of the porous low-k dielectric layer is exposed in the exposed pore, deposited metallurgy may directly contact such porous low-k dielectric layer. Direct contact between the porous low-k dielectric layer and the deposited metallurgy results in the diffusion of metal atoms, e.g., copper atoms, into the porous dielectric layer. This is undesirable as it increases the low dielectric constant (k) of the porous low-k dielectric layer, as well as degrades the dielectric properties thereof. Another disadvantage of coating via/trench opening surfaces with a deposited metal liner is that the metal material typically has a higher resistance and lower conductivity in comparison to the subsequently deposited metallurgy. This may provide a damascene wire having unacceptably high resistance that adversely affects performance of the IC.

As IC dimensions continue to shrink with future generations of semiconductor technology, these conventional techniques of depositing a barrier or liner layer to fill exposed pores in a porous dielectric layer are becoming increasingly inefficient. This is especially the case wherein exposed pores of the porous dielectric layer reside within via and/or trench openings. As IC dimensions scale down, the dimensions of these via/trench openings also decrease. In so doing, in the process of depositing a barrier liner layer to close exposed pores within via/trench openings, this deposited barrier liner layer undesirably occupies valuable space within these smaller openings. In turn, an insufficient amount of metallurgy will be subsequently depositing into the remaining openings resulting in an undesirable increase in wire resistance.

In attempting to overcome the problems associated with exposed pores, prior art has also focused on depositing inorganic dielectric layers to close these exposed pores. For instance, one such approach includes depositing a plasma enhanced chemical vapor deposition layer (PECVD), such as a PECVD $SiO_2$ layer, which conformally coats exposed surfaces of the porous dielectric layer, including any exposed surfaces with via/trench openings. Typically, the deposition of the inorganic layer continues until the exposed pores are pinched-off and closed such that a conformal PECVD layer has been deposited within via/trench openings coating exposed surfaces therein.

However, this approach of depositing inorganic dielectric layers also suffers from the problems associated with deposition of barrier liner layers. That is, they add additional thickness or material into the continually decreasing sized openings in the porous dielectric layers. Also, like that of the deposited metal liner layers, deposited inorganic layers detrimentally decrease the size of the already reduced via/trench openings even further, such that insufficient amounts of metallurgy is deposited, resulting in an increase in the wire resistant of the resultant IC. Another problem with these depositing inorganic dielectric layers is that they generally have a higher dielectric constant than the porous low-k dielectric layer to which it makes contact, thereby unacceptably increasing the overall capacitance of the IC.

Accordingly, as IC dimensions continue to scale down in size with future generations of semiconductor technology, improved structures and methods are needed to close exposed pores in a porous low-k dielectric layer, whether such exposed pores reside at exposed surface areas of the IC or within via and/or trench openings in the porous low-k dielectric layer.

SUMMARY OF INVENTION

Bearing in mind the problems and deficiencies of the prior art, it is therefore an object of the present invention to provide structures and methods for closing exposed pores within a porous low-k dielectric layer without encountering any of the deleterious effects discussed above.

Another object of the present invention is to provide structures and methods for closing exposed pores within a porous low-k dielectric layer that is scalable to smaller geometries as the line width and line height continues to shrink with future IC generations.

It is another object of the present invention to provide structures and methods for closing exposed pores within a porous low-k dielectric layer that retains feature sizes of the IC.

Still another object of the present invention is to provide structures and methods for closing exposed pores within a porous low-k dielectric layer such that upon deposition of metallurgy within via/trench openings, shorts are prevented between adjacent wires, and the electrical and physical properties of the deposited metallurgy are maintained.

A further object of the invention is to provide structures and methods for closing exposed pores within a porous low-k dielectric layer that provides a semiconductor structure having improved wire resistance and electrical conductance.

Still other objects and advantages of the invention will in part be obvious and will in part be apparent from the specification.

The above and other objects, which will be apparent to those skilled in art, are achieved in the present invention, which is directed to a method for closing exposed pores in a porous dielectric layer. The method includes providing a low-k porous dielectric layer having at least one exposed pore with a first reactant therein. A second reactant is provided into a mouth region of the exposed pore, while the first reactant is simultaneously being outgassed toward the mouth region. Contact between the second reactant with the outgassed first reactant generates an in-situ chemical reaction at the mouth region of the at least one exposed pore to form a pore-closing layer across such mouth region, which transforms the exposed pore to a closed pore having porosity. The pore-closing layer may have a thickness ranging from about 2 nm to about 20 nm inside and across the mouth region of the at least one closed pore.

In this aspect, the first reactant may be provided over the porous dielectric layer for a time sufficient to allow the first reactant absorb within the at least one exposed pore. Optionally, any residual first reactant on the porous dielectric layer may be removed prior to providing the second reactant. The low-k porous dielectric layer may include a dielectric material, a patterned low-k porous dielectric layer, or a spin-on low-k porous dielectric layer.

The in-situ chemical reaction may be allowed to occur for a time sufficient to allow the pore-closing layer grow out laterally from the closed pore to form a liner layer on exposed surfaces of the low-k porous dielectric layer. Alternatively, the liner layer may be formed by allowing the first reactant to absorb within the at least one exposed pore and adsorb onto exposed surfaces of the low-k porous dielectric layer. The second reactant then contacts the outgassed first reactant at the mouth region and the adsorbed first reactant on the exposed surfaces of the low-k porous dielectric layer to generate the in-situ chemical reaction at the mouth region and at the exposed surfaces of the low-k porous dielectric layer. In so doing, the pore-closing layer is formed across the mouth region and the liner layer is formed on the exposed surfaces of the low-k porous dielectric layer.

In another aspect, the invention is directed to a method for closing exposed pores in a porous dielectric layer prior to metallization by first providing a substrate having a low-k porous dielectric layer with a plurality of closed pores. The low-k porous dielectric layer is patterned to form openings therein, whereby selected ones of the closed pores are transformed to exposed pores within such openings. A first reactant is provided within the exposed pores, and then a second reactant is introduced into a mouth region of each exposed pore while the first reactant is simultaneously being outgassed toward the mouth region. The contact of the second reactant with the outgassed first reactant generates an in-situ chemical reaction at the mouth region of each exposed pore to form a pore-closing layer across such mouth region and transform the exposed pores to closed pores. Optionally, in addition to the pore-closing layer, the in-situ chemical reaction may form a bottomless liner layer on the exposed surfaces of the low-k porous dielectric layer within the openings.

In yet another aspect, the invention is directed to a semiconductor structure that includes a substrate with a patterned low-k porous dielectric layer on the substrate having at least one opening therein. This opening has at least one closed pore having a pore-closing layer at a site-specific location across a mouth region of the closed pore. The pore-closing layer is a product of an in-situ chemical reaction at the mouth region between a second reactant and an outgassed first reactant. A metallization layer fills the at least one opening in the patterned low-k porous dielectric layer. Optionally, the semiconductor structure may further include a bottomless liner layer on sidewalls of the at least one opening within the low-k porous dielectric layer.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

Figure 1:
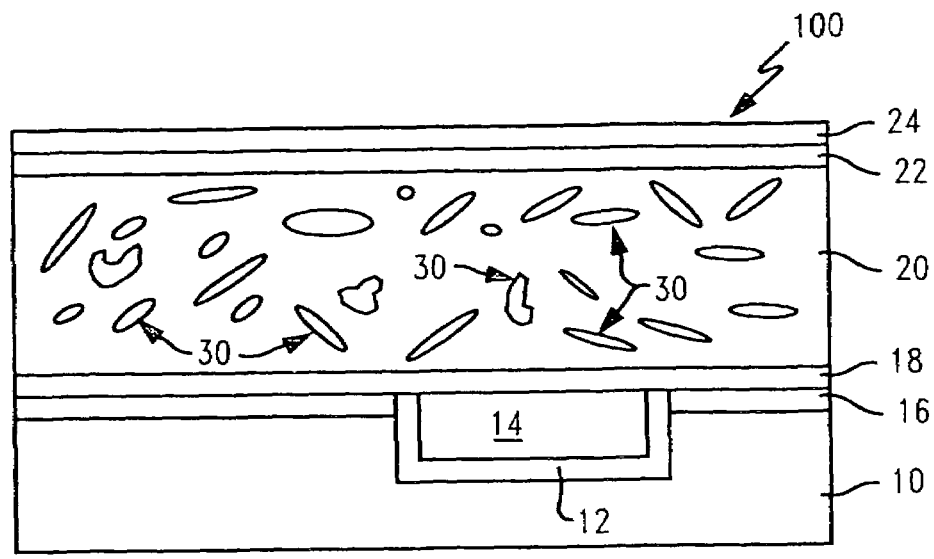
FIG. 1 is a cross-sectional view of a starting substrate for use in accordance with the invention.

In describing the preferred embodiment of the present invention, reference will be made herein to FIGS. 1–9B of the drawings in which like numerals refer to like features of the invention.

The present invention is directed to closing exposed pores within a porous low-k dielectric layer via an in-situ chemical reaction between precursors and out-gassants residing within the exposed pores. A first reactant, such as surfactant molecules, is either absorbed or left behind in exposed pores upon forming via and/or trench openings within a dielectric layer. A second reactant, such as a precursor, is then introduced into the via and/or trench openings whereby the second reactant enters the exposed pores, while first reactant molecules are simultaneously being outgassed from the exposed pores, so that a chemical reaction occurs at a mouth region of the exposed pores to form a pore-closing layer selectively within the exposed pores, and providing the via and/or trench openings with substantially smooth, planar surfaces for subsequent processing. The invention may be used to close exposed pores on exposed planar surfaces of a porous low-k dielectric layer, and/or close exposed pores residing on surfaces within via and/or trench openings etched into the porous low-k dielectric layer. The invention advantageously allows for the closing off, or sealing, of exposed pores in any known porous low-k dielectric material without creating voids therein or in any subsequently deposited layers, as well as being scalable to future generations of semiconductor technology.

As will be recognized to one of ordinary skill in the art of integrated circuit fabrication, a variety of porous low-k dielectric materials exist in the art. These porous low-k dielectric materials generally exhibit a dielectric constant (k) less than about 3.5, more typically less than about 2.7. Porous low-k dielectric layers are generally derived from either chemical vapor deposition (CVD) dielectric materials or spin-on dielectrics. CVD dielectric materials may include organosilane/organooxysilane precursors as active agents in combination with porogens to generate the low-k dielectric material having a certain amount of porosity. Examples of commercially available precursors that utilize an organic host material include, but are not limited to, porous SiCOH (Tricon's ORION™), spin-on SiCOH (JSR Corporation's JSR LKD 5109), spin-on porous $SiO_2$ (Honeywell AMM's Nanoglass™), porous poly(erylene)ether (Dow Chemical's p-SiLK™), and the like.

With respect to spin-on dielectrics, these dielectrics include one or more of organic or inorganic components having a certain amount of porosity or intramolecular spacing. Spin-on dielectrics are typically formed by a two phase process whereby a solution of low-k precursor material, comprised of a thermosetting host material and a thermally degradable "porogen" material, is applied to a substrate by any known spin-on process. Subsequently, the low-k precursor material is thermally cured by any known curing process whereby cross-linking between the thermosetting host material and the thermally degradable "porogen" material occurs to form a porous low-k dielectric material layer, concurrently with phase separation of the porogen from the host material. Such curing processes include, but are not limited to, electron beam, ultraviolet, annealing, and the like. That is, the phase separated porogen collects in nanoscopic domains within the host material and thermally decomposes into volatile by-product porogen fragments that diffuse out of the low-k dielectric material leaving pores in their place.

Porosity, i.e., the level or percentage of porosity, can vary throughout the low-k dielectric material layer, as can the shapes and sizes of the pores vary throughout such layer. The shapes of the pores residing within the porous low-k dielectric may include any regular and/or irregular shapes; whether they are elliptical, cubic, hexagonal and/or any other connected shape. Typical sizes of pores residing within porous low-k dielectric materials range anywhere from 10 Å, in mean diameter, to about 200 Å, in mean diameter. However, it should be appreciated that the actual sizes of pores residing throughout a porous dielectric layer ultimately depends on the type of low-k dielectric material from which the porous layer is made, in addition to the selected porogen used in fabricating the porous layer. For example, organic spin-on glass (OSG) may have pores of diameters ranging from about 10 Å to about 40 Å, with the mean diameter being about 25 Å, while a hydrocarbon polymer material may have pores of diameters as high as about 200 Å.

In view of the varying types of porous dielectric layers, it should be appreciated that the methods and apparatus of the invention disclosed herein are applicable to any type of porous low-k dielectric material. That is, the invention may be used with and for any porous low-k dielectric material having any shape and any size pores, as well as any amount of porosity residing throughout the porous layer.

The invention will be better understood in accordance with the below description of the invention which refers to FIGS. 1–9B.

The next several paragraphs refer to the embodiment involving direct closing of exposed pores.

Referring to FIG. 1, a starting substrate 100 is shown for use in accordance with the invention. The substrate 10 may comprise any known material that is typically present in an interconnect structure such as, but not limited to, an inter-level or intralevel dielectric, a wiring level, an adhesion promoter, a semiconductor wafer or any combinations thereof. It should be understood and appreciated by one of ordinary skill in the art that the present invention is not limited by the foregoing disclosure, but may be directed to any semiconductor structure in which a porous low-k dielectric layer is employed.

For ease of understanding the invention, the starting substrate comprises a substrate 10 having a metallization layer 14 therein, such as damascene copper, tungsten, aluminum and the like, which is fabricated using a hard mask layer 16, such as SiN, SiC, SiCN, and SiCOH by known techniques. A barrier layer 12 of suitable material physically and electrically separates the substrate 10 from the metallization layer 14. A cap layer 18 is provided over a surface of the first hard mask layer 16 such that it also covers the metallization layer 14, as known in the art.

The starting substrate 100 is completed by providing a porous low-k dielectric layer 20 over the cap layer 18, followed by, bi-layer hard mask layers 22 and 24. The bi-layer hard mask layers may comprise any known materials for use as hard masks. For example, the first hard mask layer 22 may comprise SiC, SiN, OSG and the like, while the second hard mask layer 24 may comprise a refractory metal, such as, W, Ta, TaN, Ti, TiN and the like, or even any known ternary amorphous alloy, such as, CoWP, CoWB and the like. In accordance with the invention, the porous low-k dielectric layer 20 comprises a porous low-k dielectric material having a number of pores 30, such as a CVD dielectric or a spin-on dielectric including organic porous dielectric materials, inorganic porous dielectric materials, or organic-inorganic porous dielectric materials. The pores 30 throughout the porous low-k dielectric material may vary in pore size and shape, as well as vary in the amount or percentage of porosity throughout layer 20.

Figure 2A:
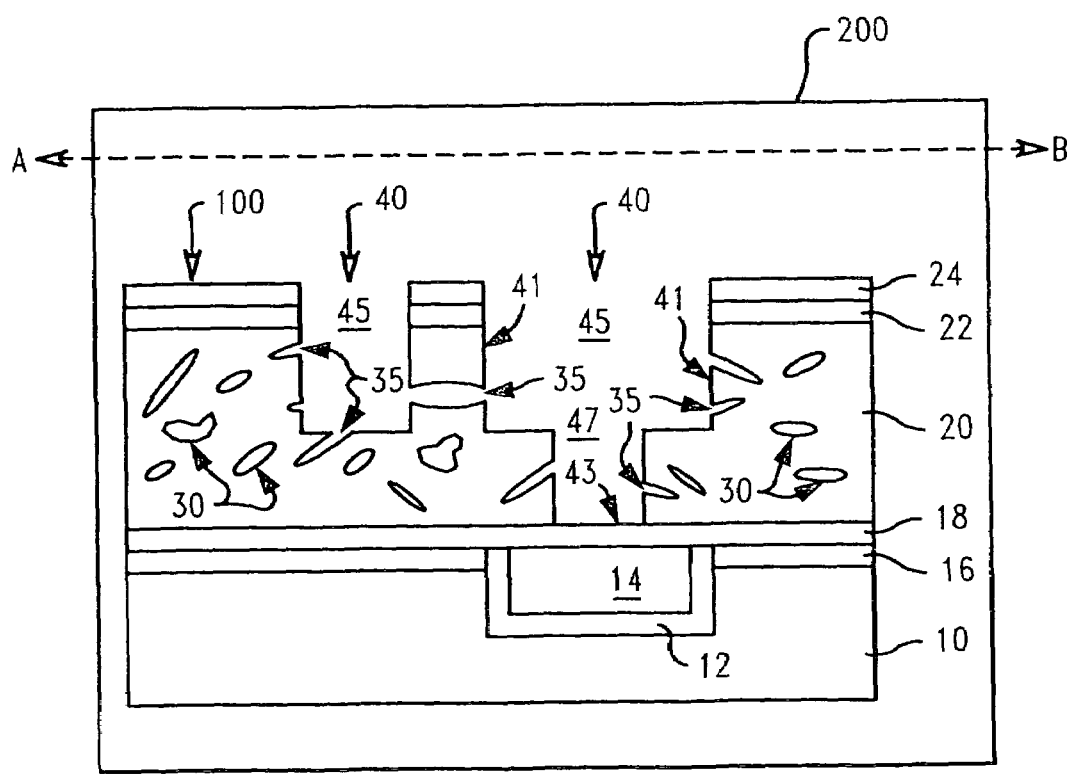
FIG. 2A is a cross-sectional view along line A–B of the starting substrate of FIG. 1 showing via and trench openings etched into the porous low-k dielectric layer, whereby selected pores are opened within the via and trench openings.
Figure 2B:
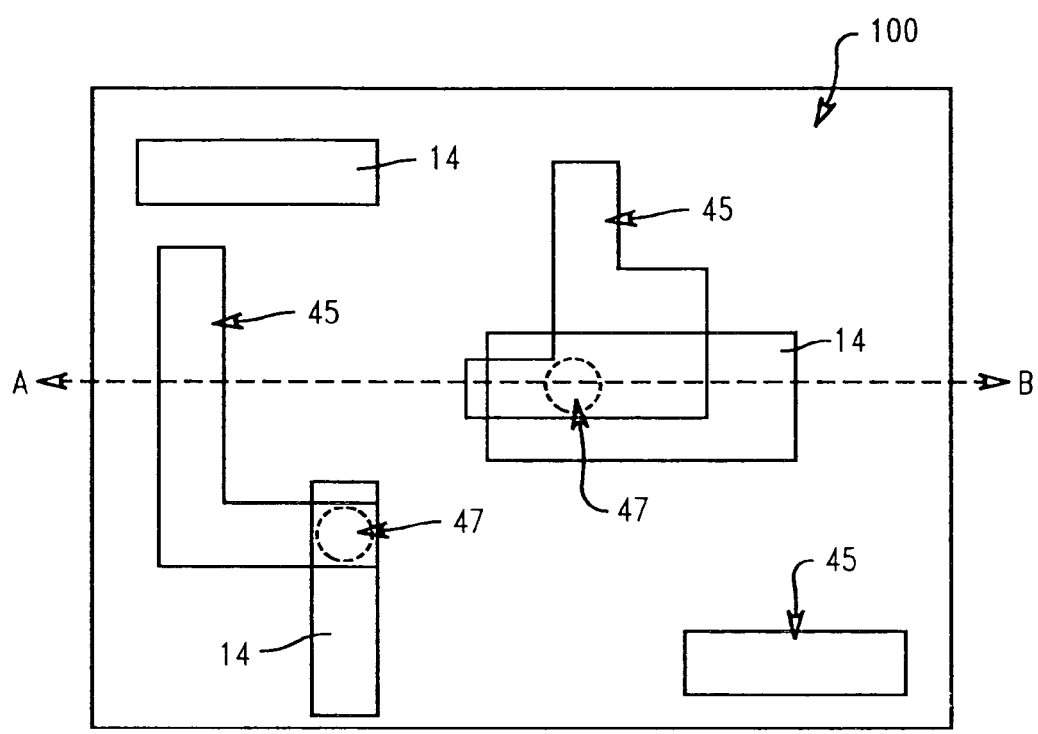
FIG. 2B is a top plane view of FIG. 2A along line A–B.

A starting substrate 100 is provided within a processing chamber 200 for forming a plurality of openings 40 by etching through bi-layer hard masks 24 and 22, and into the porous low-k dielectric layer 20. As shown in FIGS. 2A–2B, these openings 40 may include upper trenches 45 separated from lower damascene wiring metallization layers 14 by vias 47. The openings 40 may be formed by conventional lithography or etching techniques, such as, damascene and/or dual damascene processing.

The formation of openings 40 result in the opening of one or more pores in the porous low-k dielectric layer 20. These pores are commonly referred to as exposed pores 35. Exposed pores 35 may reside on surfaces within openings 40 as illustrated in FIG. 2, or may reside on a planar surface of a porous dielectric layer (not shown) when a surface of the porous dielectric layer is exposed to the etch process, i.e., when there are no bi-layer hard masks 22 and 24 residing over the porous dielectric layer. In accordance with the present invention, exposed pores may be sealed whether they reside within via/trench openings and/or on a planar surface of the porous dielectric layer.

The present invention closes or seals-off exposed pores 35 prior to any metallization steps. For instance, referring to FIG. 2, exposed pores 35 are closed prior to exposing metallization layer 14, and as such, prior to filling openings 40 with a metal for conductor formation, such as wiring formation. An advantage of the invention is that the exposed pores residing in a low-k dielectric layer are closed prior to metallization, in a manner that minimally affects and/or compromises the characteristics and properties of the porous low-k dielectric layer 20.

Figure 3:
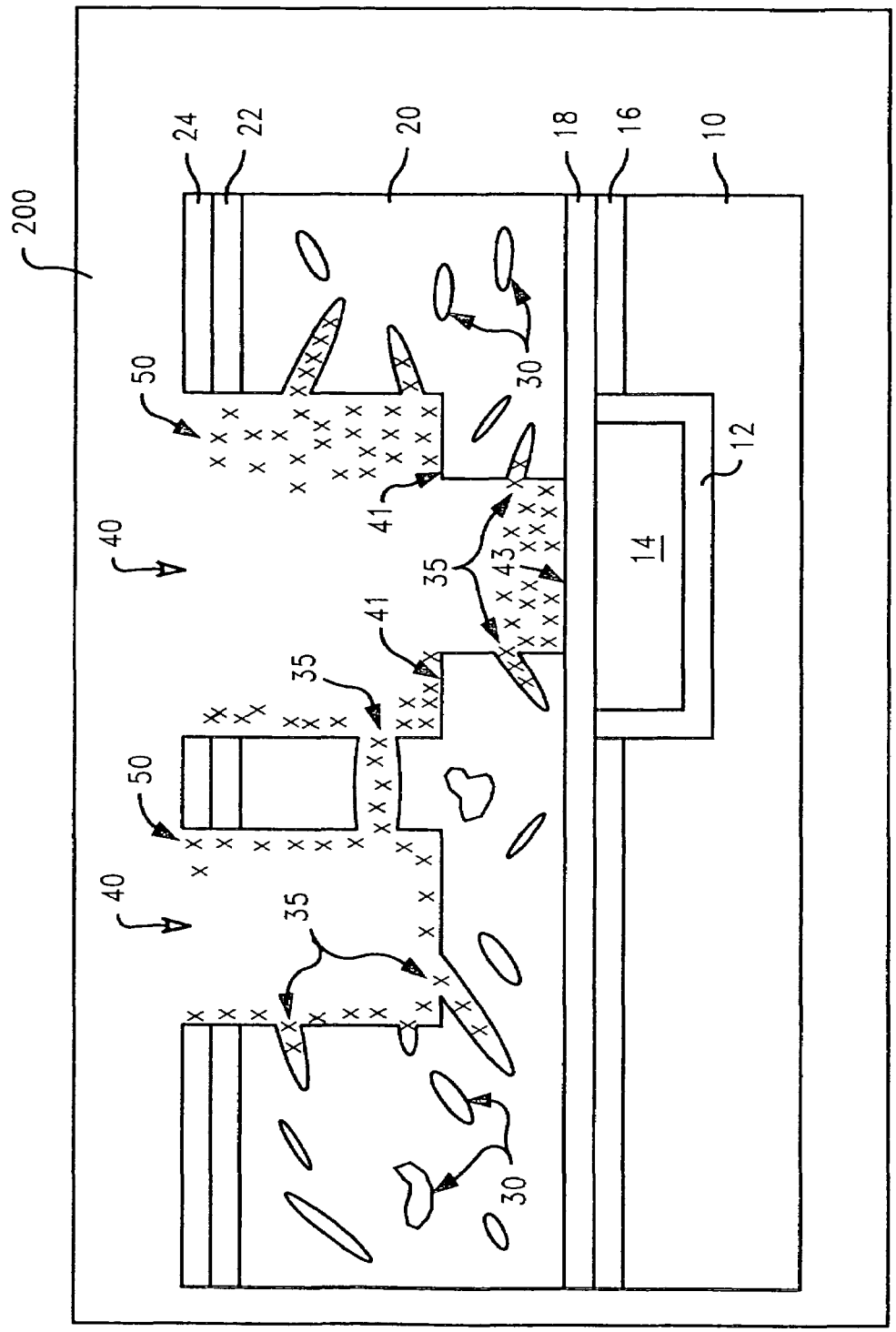
FIG. 3 is a cross-sectional view showing the step of providing a first reactant, such as a surfactant, within a processing chamber to at least allow absorption of first reactant molecules within the exposed pores of FIG. 2.

In closing the exposed pores 35 in accordance with the invention, a first reactant 50 is absorbed into the exposed pores. Referring to FIG. 3, this may be accomplished by introducing a surfactant 50 (first reactant) into the chamber under processing conditions and times sufficient to at least allow absorption of surfactant molecules within the exposed pores 35. The low-k porous dielectric layer may comprise a CVD dielectric material whereby the reactant 50 may include, for example, an oxygen-containing reactant, a carbon-containing reactant, ammonia ($NH_3$) molecules from a $NH_3$ reactant or plasma, and TEOS liquid (or vapor). Selected molecules of the reactant 50 are absorbed into these exposed pores 35 of the porous low k dielectric layer 20 and are retained therein.

The next several paragraphs refer to another embodiment of the invention involving reactive closing of exposed pores.

Figure 4:
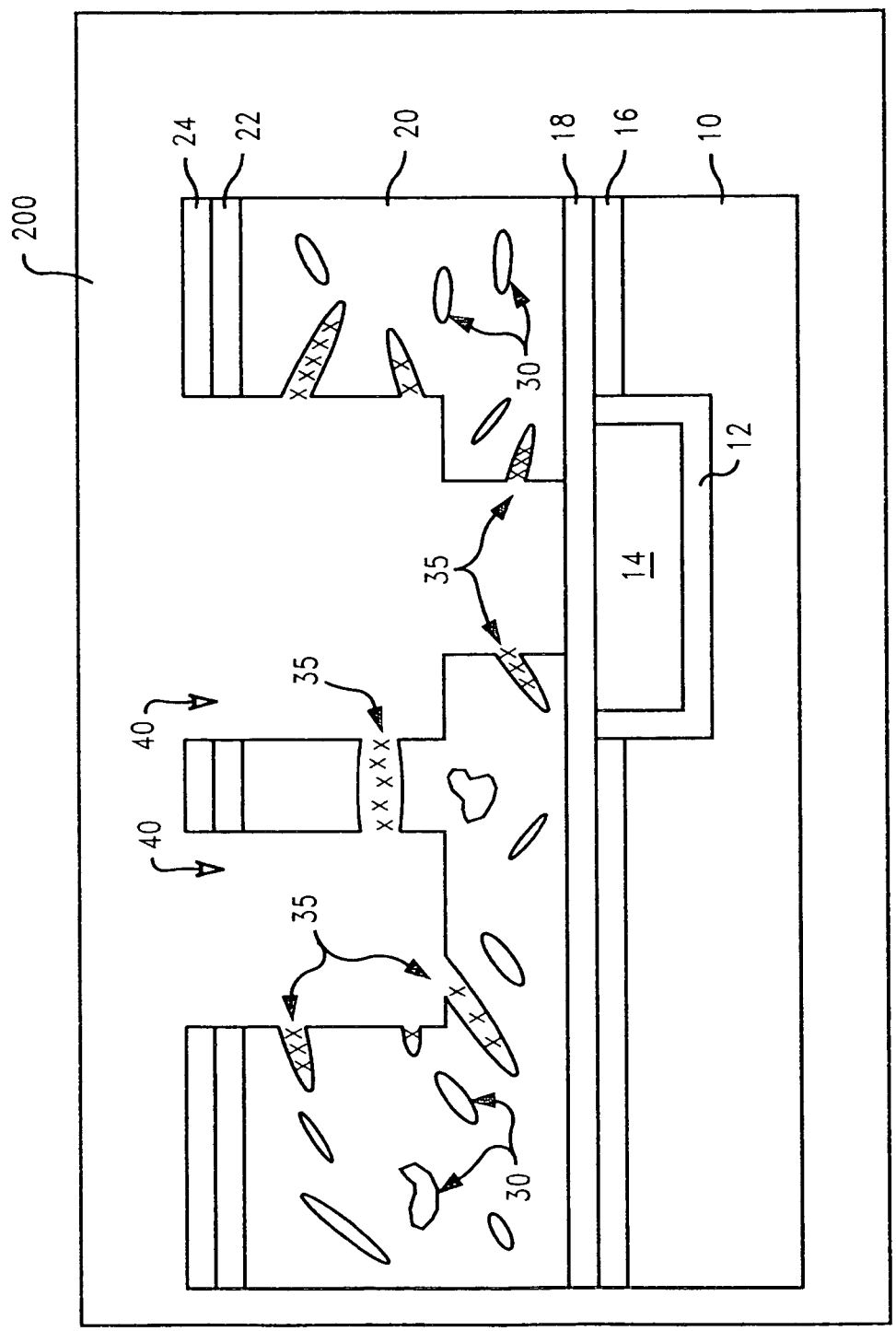
FIG. 4 is a cross-sectional view showing first reactant molecules residing only within the exposed pores either by removal of any residual surfactant molecules adsorbed onto the dielectric layer of FIG. 3, or by residual volatile by-product porogen fragments resulting from forming the via/trench openings in a spin-on low-k porous dielectric layer.

Alternatively, the low-k porous dielectric layer 20 may comprise a spin-on porous low k dielectric layer whereby the dielectric layer undergoes a partial cure step to cross-linking a host material with porogens, concurrently with phase separation of the porogen from the host material, to form the porous layer. In so doing, a majority, but not all, of the volatile by-product porogen fragments diffuse out of the low-k dielectric material to leave pores, with residual volatile by-product porogen fragments remain inside the pores for subsequent use in accordance with the invention. Upon forming openings 40 within this spin-on low-k porous dielectric layer, selected pores are exposed within the openings 40, whereby as shown in FIG. 4, the residual volatile by-product porogen fragments reside within these exposed pores 35. For example, the exposed pores 35 may contain residual oxygen-containing or carbon-containing molecules.

Figure 6:
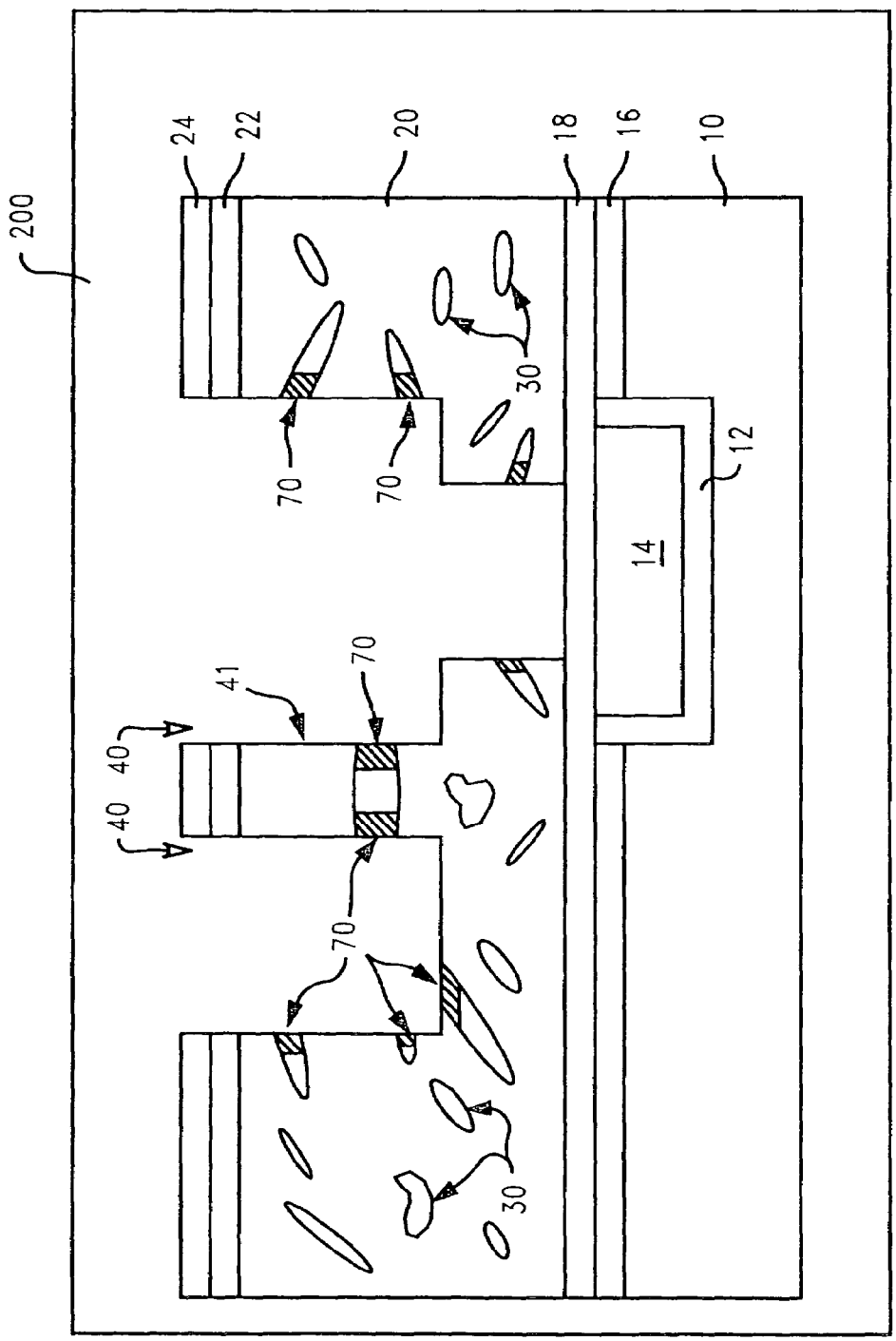
FIG. 6 is a cross-sectional view of FIG. 5 showing the site-specific in-situ pore-closing layer of the invention formed at the mouth region within the exposed pores.
Figure 7:
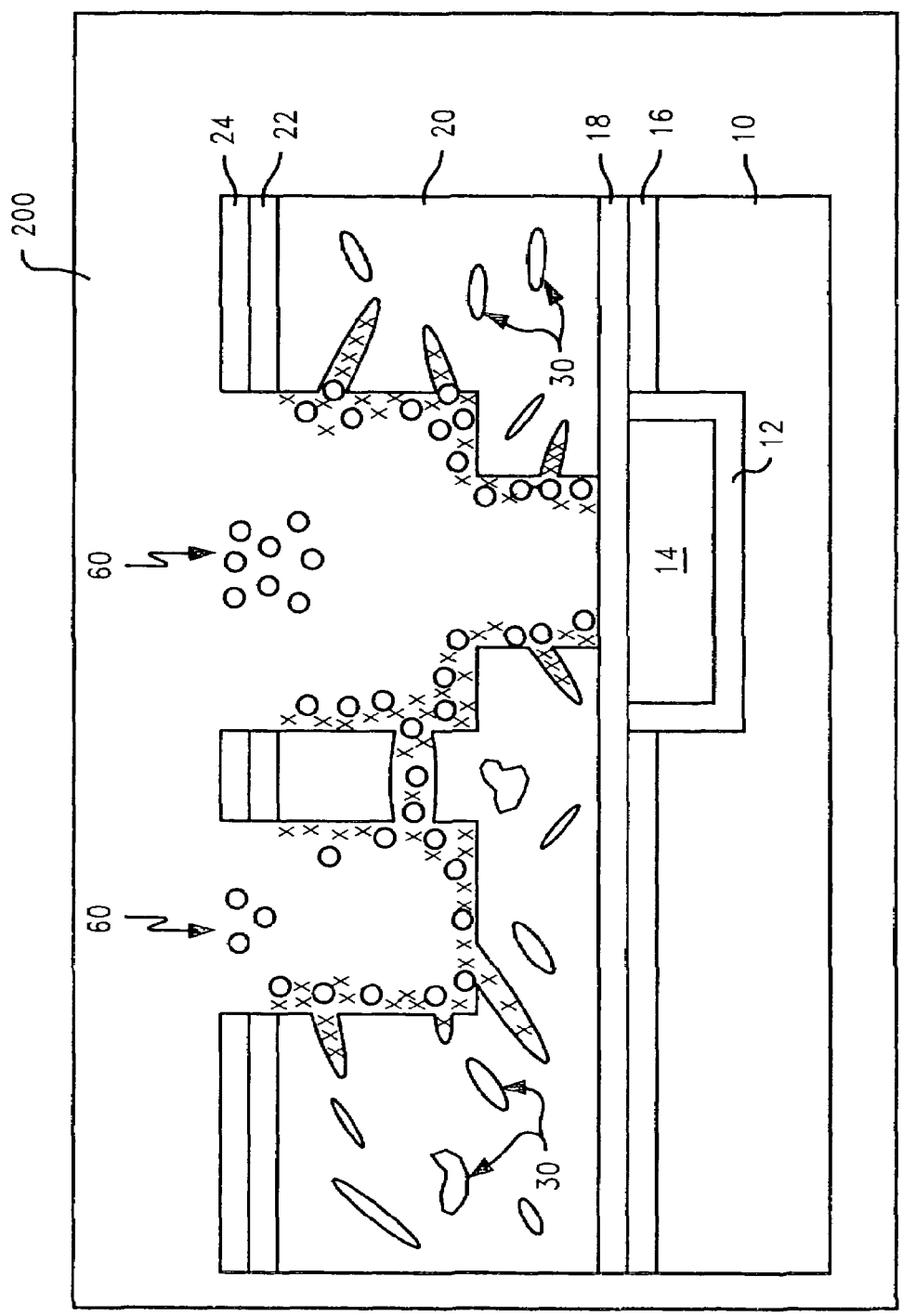
FIG. 7 is a cross-sectional view of FIG. 3 showing first reactant molecules absorbed into the exposed pores and adsorbed onto the porous dielectric layer within the via/trench openings, whereby the second reactant is introduced into the via/trench openings to react with both absorbed and adsorbed first reactant molecules.
Figure 8:
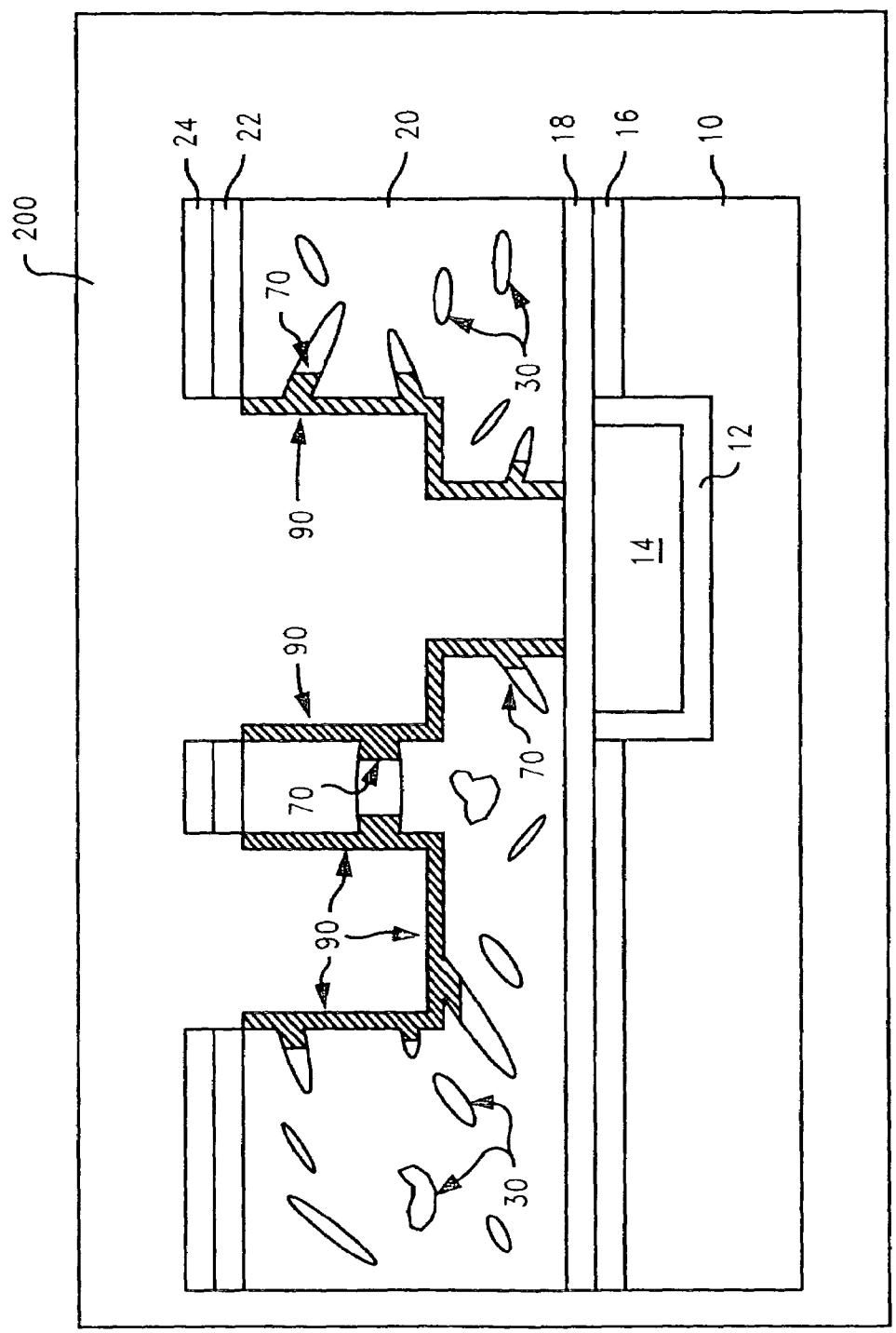
FIG. 8 is a cross-sectional view showing the bottomless liner and the site-specific in-situ pore-closing layer within exposed pores of the invention as a result of the reaction between second reactant molecules and absorbed and adsorbed first reactant molecules of FIG. 7.

If a surfactant is used, a first reactant, such as surfactant 50, is absorbed into the exposed pores by deposition, as is shown in FIG. 3. Any residual surfactant molecules deposited onto interior wall 41 and bottom 43 surfaces of the porous low k dielectric layer within openings 40 are then removed so that surfactant molecules only reside within the exposed pores, as shown in FIG. 4, for formation of the pore-closing layers 70, as shown in FIG. 6. The removal of residual surfactant molecules may be accomplished by known techniques, such as known drying techniques, under sufficient processing conditions and times such that absorbed surfactant molecules now only reside within the exposed pores 35. Alternatively, this step may be skipped, so that residual surfactant molecules remain on the surfaces 41, 43 of the porous dielectric layer within openings 40 and within exposed pores 35, as shown in FIG. 7, for formation of a bottomless liner layer 90 in combination with the pore-closing layer 70 within exposed pores 35, as shown in FIG. 8. In accordance with the invention, the pore-closing layer 70 may comprise a pore-closing dielectric layer or a pore-closing metal layer.

Optionally, if a surfactant is used, prior to exposing the porous low k dielectric layer to surfactant 50, the openings 40, and more preferably the exposed pores 35, may be pre-treated for purposes of increasing the hydrophilic nature of the porous dielectric layer. This may be accomplished by pre-treating the substrate with a plasma containing $O_2$, $H_2$, $N_2$, AR, and the like, at temperatures ranging from about 20° C. to about 450° C., and pressures ranging from about 1 mTorr to about 30 Torr in order to increase the hydrophilic nature of the exposed pores 35 prior to introduction of the surfactant 50.

Figure 5:
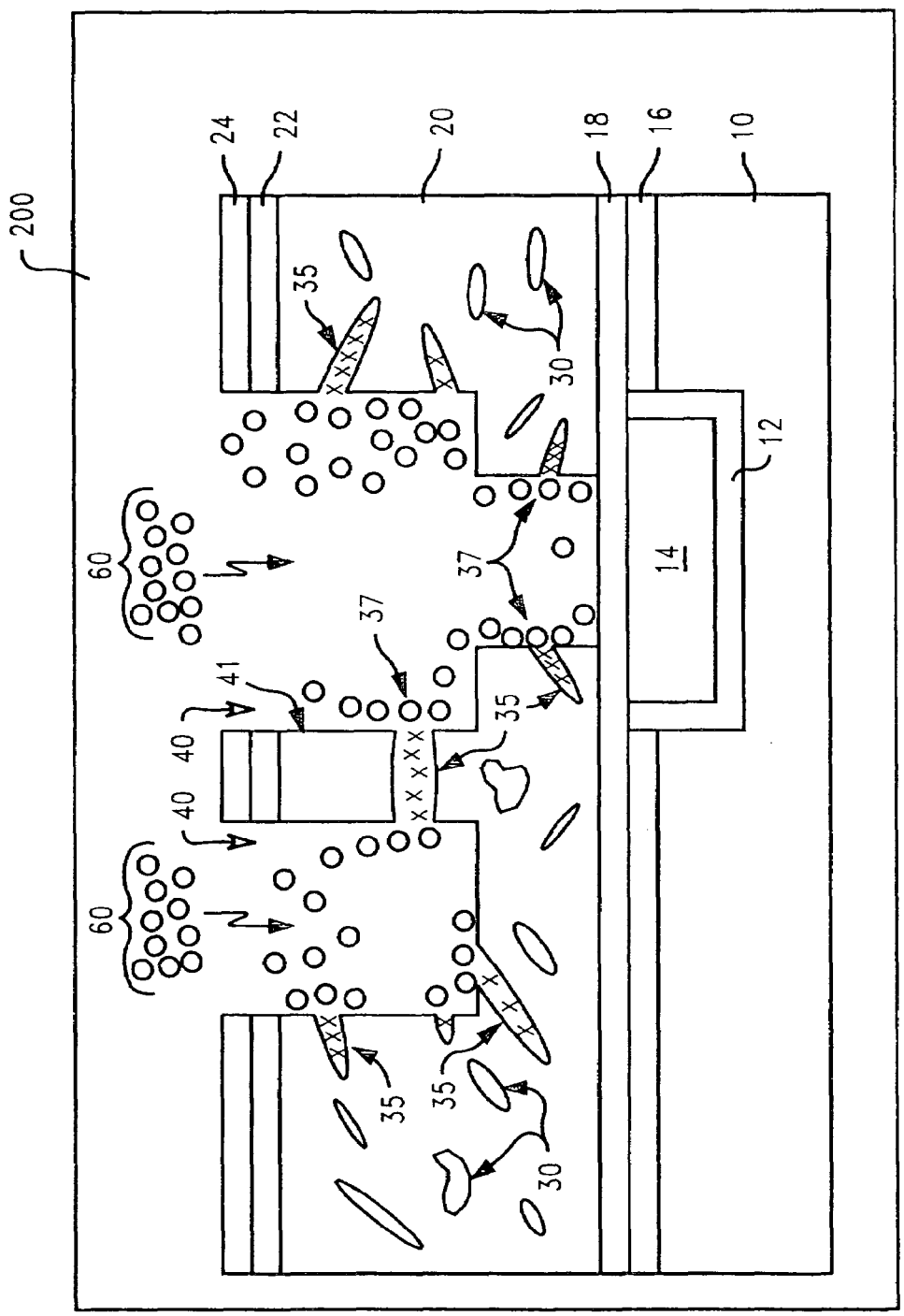
FIG. 5 is a cross-sectional view of FIG. 4 showing the step of introducing a second reactant into the via/trench openings and into the exposed pores therein.

Referring to FIG. 5, wherein surfactant molecules reside only with in the exposed pores 35, a second reactant 60 is provided within openings 40. Optionally, wherein a liner 90 (as shown in FIG. 8) is formed in combination with the pore-closing dielectric or metal layer 70 (as shown in FIG. 6), surfactant molecules may be absorbed and reside within the exposed pores 35, and be adsorbed onto the porous low k dielectric material of layer 20 within openings 40. In accordance with the invention, second reactant 60 may include, but is not limited to, a silane-containing plasma, a CVD TiN plasma in the absence of any $NH_3$ flow, an acidic bath solution, and the like.

The second reactant 60 is provided into openings 40 using a reactor within the processing chamber or immersion into a bath solution. In so doing, in either processing, the second reactant 60 is introduced into the openings 40 while absorbed first reactant molecules, i.e., surfactant molecules, residing within the exposed pores 35 are simultaneously being outgassed toward a mouth region 37 of the exposed pores 35. Second reactant molecules flow into the exposed pores 35 such that they directly contact, and react with, the outgassed absorbed first reactant molecules at the mouth region 37. This in-situ reaction of the invention advantageously results in a number of these dielectric molecules to bond together to site-specifically form the in-situ pore-closing layer 70 inside the exposed pores across the mouth region 37 to close off or seal such exposed pores 35 as shown in FIG. 6. This in-situ pore-closing layer 70 may have a thickness ranging from about 2 nm to about 20 nm inside the exposed pores 35, and is preferably planar with the interior walls 41 and bottom surfaces 43 of openings 40.

Referring to FIGS. 4–6, wherein surfactant molecules reside only within the exposed pores 35, the in-situ pore-closing layer 70 is formed only at the site-specific location of the mouth region of the exposed pores. However, referring to FIGS. 7–8, wherein surfactant molecules reside within the exposed pores 35 and are adsorbed onto the porous low k dielectric material of layer 20 within openings 40, the in-situ pore-closing layer 70 is formed at the site-specific location of the mouth region, in addition to forming a bottomless liner 90 only on the porous low k dielectric material of layer 20 within openings 40. A bottomless liner covers the sides of etched vias and trenches, but not the via bottoms or wire tops.

The pore-closing layer 70 and the bottomless liner 90 may include, for example, site-specific in-situ SiO dielectric layers, SiC dielectric layers, SiCN, SiCOH, and the like. In accordance with the invention, the low dielectric constant (k) nature of the porous low k dielectric layer 20 is advantageously maintained as a result of forming the pore-closing layer 70 only at the mouth region 37 of the exposed pores 35, thereby retaining a portion of each of the exposed pores to maintain porosity throughout layer 20. Another advantage of the invention is that the pore-closing layer 70 is formed at the mouth region 37 inside the exposed pores 35 such that openings 40 within the porous dielectric layer 20 are provided with smooth, planar surfaces for subsequent processing.

The invention will be better understood below in accordance with various examples of the invention.

EXAMPLE 1

Dual damascene or single damascene trenches and vias, as discussed above, are formed as known in the art. The present invention provides for closing these exposed pores 35 by first introducing a first reactant, such as, an oxygen-containing surfactant 50 into the chamber, as shown in FIG. 3. For example, water molecules may first be introduced into the chamber. The porous low k dielectric layer may be exposed to the water molecules under processing conditions including pressures ranging from about 1mTorr to about 7,600 Torr, temperatures ranging from about 50° C. to about 450° C., for a time sufficient to at least allow filling the exposed pores 35 with absorbed water molecules, such as a time ranging from about 10 seconds to about 1 hour.

By exposing the porous low k dielectric layer to these oxygen-containing surfactant molecules, e.g., water molecules, under the above processing parameters, the oxygen-containing molecules are provided into openings 40 within the porous low k dielectric layer 20. In so doing, selected ones of these water molecules 50 absorb into the exposed pores 35 within the openings 40 such that these exposed pores 35 retain the absorbed water molecules for further processing in accordance with the invention.

The structure is then processed to remove any water molecules that may have been deposited onto interior wall surfaces 41 of the openings 40 within the porous layer 20, as well as any water molecules that may have been deposited onto the bottom surface 43 of openings 40. In so doing, absorbed water molecules will now only remain within the exposed pores 35 as shown in FIG. 4. Excess water molecules may be removed by drying the structure using known apparatus for a time sufficient to dry any excess water molecules, e.g., times ranging from about 10 seconds to about 1 hour.

Optionally, prior to exposing the porous low k dielectric layer to the oxygen-containing molecules, i.e., water molecules, the openings 40, and more preferably the exposed pores 35, are pre-treated with plasma containing $O_2$, $H_2$, $N_2$, AR, and the like, at temperatures ranging from about 20° C. to about 450° C., and pressures ranging from about 1 mTorr to about 30 Torr in order to increase the hydrophilic nature of the exposed pores 35 prior to introduction of the water molecules 50.

Referring to FIG. 5, once the water molecules 50 are absorbed only within the exposed pores 35, these absorbed water molecules are treated with a reactant via a reactor source within the chamber, or alternatively, immersion into a bath solution. For example, the wafer may be exposed to a silane-containing plasma 60 at a temperature of about 20° C. to about 450° C., preferably at about 100° C., and pressures ranging from about 1 mTorr to about 30 Torr, preferably 1 Torr. The silane-containing plasma may include, but is not limited to, a silane plasma ($SiH_4$), a 1-methylsilane plasma ($SiH_3(CH_3)$), a 2-methylsilane plasma ($SiH_2(CH_3)_2$), a 3-methylsilane plasma ($SiH(CH_3)_3$) or a 4-methylsilane plasma ($Si(CH_3)_4$).

While the silane-containing plasma is being provided within the openings 40, the absorbed water molecules are simultaneously being outgassed from within the exposed pores 35 toward a mouth region 37 of such pores. In so doing, the silane-containing plasma directly contacts and reacts with outgassed absorbed oxygen-containing molecules, i.e., water molecules, inside the exposed pores 35 at a site-specific location residing at the mouth region 37 of such exposed pores 35. This reaction between silane-containing plasma molecules and oxygen-containing water molecules at the mouth region 37 forms in-situ dielectric molecules within the exposed pores only at the specific site of the mouth region 37. A number of these dielectric molecules then bond together to form an in-situ pore-closing layer 70 across the mouth region 37 of the exposed pores 35 such that the exposed pores are closed or sealed as shown in FIG. 6. This in-situ pore-closing layer 70 may have a thickness ranging from about 2 nm to about 20 nm inside the exposed pores 35, and is preferably planar with the interior walls 41 and bottom surfaces of openings 40.

For instance, wherein the reactant is a silane plasma (SiH), these silane molecules react with outgassed water molecules at mouth region 37 to form silicon dioxide ($SiO_2$). In accordance with the invention, the $SiO_2$ is selectively formed such that it is concentrated at the mouth region 37 inside the exposed pores 35. Upon formation of sufficient amounts of $SiO_2$, a layer of the $SiO_2$ eventually bond together to form a continuous $SiO_2$ dielectric layer within the exposed pores 35 and across an entire length of the mouth region 37 to close off or seal the exposed pores 35.

In the present invention, the $SiO_2$ dielectric layer is formed only at the mouth region 37, inside each of the exposed pores 35, such that regions of these exposed pores 35 remain porous for the benefit of preserving the low dielectric constant (k) nature of the porous low k dielectric layer 20. A further feature of the invention is that as the pore-closing layers 70 of the invention are site-specifically formed only at mouth regions 37 located inside exposed pores 35 of porous layer 20 to close such exposed pores, the openings 40 within such porous layer 20 are provided with smooth, planar surfaces for subsequent processing.

As an alternate to the above processing steps, and still without deviating from the novel concept of the invention, rather than closing exposed pores 35 via the reaction between outgassed oxygen-containing molecules, i.e., water molecules 50, and the silane-containing plasma, these exposed pores 35 may be site-specifically closed via selective liquid phase deposition. This can be accomplished by selectively growing a thin $SiO_2$ layer only at the site-specific locations of mouth region 37 of exposed pores 35 to advantageously close off or seal such exposed pores 35. The $SiO_2$ layer is preferably grown inside the exposed pores 35 at the region of the mouth region 37 so that the interior surface of openings 40 are provided with smooth, planar surfaces. In accordance with the invention, the $SiO_2$ layer may be grown to a thickness ranging from about 2 nm to about 20 nm inside the exposed pores 35.

That is, once the water molecules 50 are absorbed into the exposed pores 35, and any excess water molecules removed from interior walls and bottom surfaces of openings 40, as discussed above, so that the water molecules 50 reside only within the exposed pores 35 as shown in FIG. 4, the structure is then immersed into a solution for formation of the exposed pore-closing layer 70 of the invention. This bath preferably contains a solution of hydrofluorosilicic acid ($H_2SiF_6$), silicic acid ($SiO_2:H_2O$) and boric acid ($B_2O_3:H_2O$) for site-specifically forming the $SiO_2$ layer only at mouth region 37 of exposed pores 35. For example, J. Chou, et al., The Initial Growth Mechanism of Silicon Oxide by Liquid-Phase Deposition, J. Electrochem. Soc., Vol. 141, No. 11, pgs. 3214–18 (November 1994) generally teaches that a $SiO_2$ layer can be formed by the following reactions:

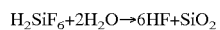

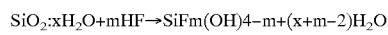

A critical feature of the invention is that hydroxyl molecules are simultaneously outgassed from the exposed pores 35 during the process of immersing the substrate in the acidic solution. As such, an in-situ chemical reaction occurs between acidic molecules and hydroxyl molecules only at the site-specific location of mouth region 37 of exposed pores 35 to form a $SiO_2$ layer 70 within the exposed pores 35 and entirely across mouth region 37, thereby seal or close-off the exposed pores 35. In so doing, the $SiO_2$ layer is grown only across the mouth region 37 within the exposed pores 35 so that regions of such exposed pores remain porous for the benefit of preserving the advantageous property of providing a porous low k dielectric layer 20 with a dielectric constant (k) less than 3.5, more preferably less than about 2.7.

EXAMPLE 2

As an alternative to the above Examples, and without deviating from the novel concept of the invention, a carbon-containing surfactant may be deposited into openings 40 for a time sufficient to allow carbon-containing surfactant molecules absorb within the exposed pores 35 and be retained therein. This carbon-containing surfactant may include, but is not limited to, carbon ($C_2$) Dupanol SP. The carbon-containing surfactant may be introduced into the processing chamber for absorption within the exposed pores 35 under aqueous or supercritical $CO_2$ processing conditions.

Upon completion of the carbon-containing surfactant deposition process, residual deposited carbon-containing surfactant is removed from the substrate 100, and in particular, from surfaces of the porous low k dielectric layer, including any interior surfaces of openings 40 within porous layer 20. Deposited carbon-containing molecules are removed from interior wall surfaces 41 and bottom surfaces 43 of openings 40, such that absorbed carbon-containing molecules now only reside within the exposed pores 35 for further processing in accordance with the invention. Preferably, the undesired carbon-containing molecules are removed by drying the structure using known apparatus for a time sufficient to dry any excess undesired carbon-containing molecules, e.g., drying for times ranging from about 10 seconds to about 1 hour.

Once the carbon-containing molecules reside only within exposed pores 35, like that of the above approaches, the porous low k dielectric layer is exposed to a reactant 60. Preferably, a silane-containing plasma is provided into the chamber and into openings 40 at temperatures ranging from about 20° C. to about 450° C., preferably at about 100° C., and pressures ranging from about 1 mTorr to about 30 Torr, preferably 1 Torr. Again, the silane-containing plasma may include silane, or even a mono, di, tri or tetra methylsilane plasma.

In accordance with the invention, and referring to FIGS. 5 and 6, as the porous layer is exposed to the silane-containing plasma, absorbed carbon-containing molecules are simultaneously being outgassed from within the exposed pores 35 toward the mouth region 37 of the exposed pores 35. An in-situ reaction occurs between the silane-containing plasma molecules and absorbed carbon-containing molecules at the site-specific location of the mouth region 37 inside exposed pores 35. For example, silane (SiH 4) plasma molecules may react in-situ with outgassed carbon-containing ($C_2$) molecules to generate SiC dielectric molecules at the mouth region 37 of the exposed pores 35.

Again, this in-situ reaction generates in-situ dielectric molecules that bond together to form an in-situ pore-closing layer 70 across the mouth region 37 inside exposed pores 35 to close off or seal such exposed pores, while retaining porous regions of each exposed pore for maintaining the low dielectric constant (k) of the porous layer 20, as well as providing openings 40 with smooth, planar surfaces for subsequent processing steps. As an alternative to this approach, rather than forming pore-closing layer 70 via treatment with a silane-containing plasma, the structure may be immersed into a solution for formation of the exposed pore-closing layer 70 as discussed above.

EXAMPLE 3

Also illustrated by FIGS. 3–6, another alternate to the above examples, and again without deviating from the novel concept of the invention, the porous low k dielectric layer may comprise a porous organic material, such as porous SiLK™, whereby ammonia ($NH^3$), TEOS liquid (or vapor), and the like, is readily absorbed by such organic material. Like the examples of the invention described above, $NH_3$ 50 may be exposed into openings 40 for a time sufficient to allow $NH_3$ molecules to absorb within the exposed pores 35 and be retained therein. In so doing, if a plasma is used, the $NH_3$ plasma is processed under conditions including pressures of about 1 mTorr to about 100 Torr, temperatures of about −50° C. to about 450° C., and a time ranging from about 10 seconds to about 1 hour.

Any excess undesired $NH_3$ is then removed from surfaces of the porous layer 20, and in particular, from interior walls and bottoms of openings 40 within porous layer 20, such as by annealing or exposure to a plasma, so that the $NH_3$ molecules now only reside within the exposed pores 35 as shown in FIG. 4. Once the $NH_3$ molecules are absorbed within and reside only in the exposed pores 35, a TiN precursor 60 may be deposited into the openings 40 in the absence of any $NH_3$ flow, preferably by chemical vapor deposition (CVD). CVD TiN can be deposited using MOCVD or remote plasma CVD, at temperatures of about 400° C. by reacting $NH_3$ with TDMAT (tetrakis(dimethyl amino)titanium) or TDEAT (tetrakis(diethyl amine)titanium), as is known in the art.

Like the above approaches, as shown in FIG. 5 during the TiN CVD process, absorbed $NH_3$ molecules are simultaneously outgassed from within the exposed pores 35 toward the mouth region 37 of the exposed pores 35. In accordance with this example of the invention, these outgassed $NH_3$ molecules are preferably the only $NH_3$ molecules present within openings 40. Again, an in-situ reaction occurs between selected TiN precursor molecules and the outgassed $NH_3$ molecules at the site-specific location of the mouth region 37 inside exposed pores 35. That is, TiN precursor molecules are selectively nucleated by outgassed $NH_3$ molecules at the mouth region 37 within such exposed pores 35. This in-situ reaction between selected TiN precursor molecules and outgassed $NH_3$ molecules forms a TiN deposited pore-closing layer 70 only across the mouth region 37 inside exposed pores 35 to close off or seal the exposed pores. The TiN deposited pore-closing layer 70 retains porous regions of each exposed pore for maintaining low dielectric constants (k) and provides openings 40 with smooth, planar surfaces.

EXAMPLE 4

Another alternative to the above examples, and without deviating from the novel concept of the invention, includes forming a spin-on porous low k dielectric layer 20 on top of the substrate 10, directly over cap layer 18. This spin-on porous low-k dielectric layer may be an organic spin-on porous layer, an inorganic spin-on porous layer, or even an organic-inorganic spin-on porous layer.

In this approach of the invention, the spin-on porous low k dielectric layer is formed by the two phase process whereby a solution of low-k precursor material is initially deposited over the cap layer 18 by known spin-on techniques. This low-k precursor material is composed of a thermosetting host material and a thermally degradable "porogen" material. Any known commercially available precursors that utilize an organic, inorganic or organic-inorganic host material may be used in accordance with the present invention. The deposited spin-on low-k precursor material then undergoes a thermal cure process using known equipment.

However, a critical feature of the invention is that this thermal cure step of the invention only partially cures the low-k precursor material. That is, the low-k precursor material is only partially thermally cured for a time sufficient to at least allow cross-linking between the thermosetting host material and the thermally degradable "porogen" material for formation of the porous low-k dielectric material layer. Thermal cures times in accordance with the invention range from about 10 seconds to about 1 hour.

As a result of this partial cure step of the invention, the cross-linking between the host material and the porogens occurs concurrently with phase separation of the porogen from the host material to form the porous layer. In so doing, the phase separated porogen collects in nanoscopic domains within the host material and thermally decomposes into volatile by-product porogen fragments. However, an essential feature of the invention, and in particular due to the partial thermal cure step, is that a majority, but not all, of the volatile by-product porogen fragments diffuse out of the low-k dielectric material leaving closed pores in their place. Residual volatile by-product porogen fragments remain inside the closed pores for subsequent use in accordance with the invention for closing off or sealing any exposed pores within the formed porous low-k dielectric material layer. Depending on the initial material of the thermally degradable "porogen" material, these residual volatile by-product porogen fragments may include, but are not limited to, carbon, oxygen, chlorine, and/or hydrogen.

Openings 40 may then be formed in the porous low-k dielectric layer, which in turn may expose certain pores within the porous layer to result in exposed pores 35. As shown in FIG. 4, residing within these exposed pores 35 are the retained residual volatile by-product porogen fragments. For example, the exposed pores 35 may contain residual oxygen-containing or carbon-containing molecules therein.

As discussed above, in relation to Examples 1 and 2, these oxygen-containing or carbon-containing molecules may then be treated with a reactant (e.g., a silane-containing plasma) whereupon the oxygen-containing or carbon-containing molecules concurrently outgas from within the exposed pores 35. As the reactant diffuses or flows into the exposed pores 35, a reaction occurs between the reactant and the outgassed molecules at the mouth region 37 of and within the exposed pores 35, thereby forming an in-situ pore-closing layer 70 (e.g., a $SiO_2$ dielectric layer or SiC dielectric layer) within the exposed pores to close off and/or seal such exposed pores with the advantages and benefits realized in accordance with the invention, as discussed above.

EXAMPLE 5

In accordance with the invention, and still without deviating from the novel concept of the invention, in addition to selectively depositing a dielectric layer within exposed pores to close off or seal such exposed pores 35, the method and apparatus of the invention may further form a bottomless liner in areas adjacent metallization layers concurrently with the selectively formed dielectric layers within exposed pores 35.

In so doing, the porous low k dielectric layers 20 and openings 40 therein are fabricated as discussed above. With respect to Examples 1–3, an oxygen-containing surfactant plasma, carbon-containing surfactant plasma, ammonia (NH 3) plasma (vapor or liquid) or TEOS liquid (or vapor), may be provided over surfaces of a porous low k dielectric layer 20 and deposited or diffused into openings 40 therein. These plasmas, gases, liquids, and/or vapors are deposited for a sufficient time to allow selected molecules thereof absorb within the exposed pores, as well as to allow adsorption of other molecules of such plasma, gas, liquid, and/or vapor only onto surfaces of the porous low k dielectric layers 20 within openings 40. These adsorbed molecules form a thin film only on the interior wall surfaces of the porous low k dielectric layers 20 within openings 40. Referring to FIG. 7, any cap layer 18 exposed at a bottom of one of the openings 40 is not permeable to these plasma, gas, liquid, and/or vapor molecules, and as such, adsorbed film is not deposited or absorbed onto the exposed cap layer 18. This is essential to the invention as the deposited molecules are only adsorbed onto the porous low k dielectric material of layer 20 within openings 40.

Once absorbed molecules of the deposited plasma, gas, liquid, and/or vapor are retained within exposed pores 35, and others are adsorbed onto the interior wall surfaces of the porous low k dielectric layers 20 of openings 40, reactant 60 is flown into the processing chamber and into openings 40. As discussed above, the reactants may be deposited by CVD or PVD, or even selective liquid phase deposition, and may include, but are not limited to, a silane-containing plasma, a TiN deposition, an acidic solution, and the like.

The reactant 60 is introduced into openings 40 such that it flows or diffuses into exposed pores and contacts the absorbed molecules therein, which are simultaneously being outgassed from within the exposed pores 35 toward the mouth region 37 of the exposed pores. The in-situ reaction of the invention occurs at the mouth region 37 within the exposed pores to form pore-closing layer 70 at the mouth region 37 for site-specifically forming the pore-closing layer 70 and closing off the exposed pores 35. Concurrently, reactant 60 also reacts with the adsorbed molecule film that resides only on surfaces of the porous dielectric layer within openings 40 as shown in FIG. 7.

Referring to FIG. 8, the dual-reaction between reactant 60 with absorbed molecules within exposed pores 35 and reactant 60 with adsorbed molecules only on sidewall surfaces of the porous dielectric layer within openings 40 simultaneously forms pore-closing layer 70 within exposed pores 35 in combination with a selective in-situ liner 90 only on exposed sidewall surfaces of the porous dielectric layer (bottomless liner process) prior to metallization, e.g., conductor formation. In those openings 40 not having porous low k dielectric layer residing at the bottom thereof, but rather, for example, cap layer 18 as shown in FIGS. 7 and 8, liner 90 comprises a bottomless liner. That is, the invention advantageously creates a bottomless liner in a manner that avoids sputter processing or CVD, which can undesirably lead to diminished trench bottom thickness as a result of via contact sputter, and as such avoids the need for any subsequent sputter cleaning processing. The selective dielectric layer and bottomless liner of the invention may be comprised of, for example, $SiO_2$, SiC, TiN, and the like.

In forming a bottomless liner for a spin-on porous low k dielectric layer in accordance with the invention, the two phase spin-on porous low k dielectric layer is formed and then the openings 40 formed therein. In so doing, exposed pores 35 are formed that retain the residual volatile by-product porogen fragments, e.g., carbon, oxygen, chlorine, and/or hydrogen fragments. As discussed above in relation to Example 4, the reactant (e.g., a silane-containing plasma) is exposed to the exposed pores for in-situ reaction with the residual volatile by-product porogen fragments that is simultaneously being outgassed from the exposed pores.

However, rather than only closing or sealing off the exposed pores, the reactant is diffused into or exposed to the openings for a time sufficient to allow the in-situ chemical reaction between the deposited reactant and outgassed volatile by-product porogen fragments occur such that the in-situ formed pore-closing layer 70 grows out laterally from the exposed pores and forms a continuous, bottomless liner 90.

In forming liner 90 of the invention, the structure may be treated with ammonia and exposed to a PVD Ti, Ta, W, or the like, deposition such that a barrier material is formed on sidewalls of the dielectric layer and a metallic via contact is formed at the bottom of any openings 40 having exposed metallurgy. For example, wherein the structure is treated with ammonia and exposed to a PVD Ti deposition, a TiN barrier layer forms only on the exposed surfaces of porous dielectric layer within openings 40, while the Ti alloys with the exposed via contact metallurgy. As such, the TiN barrier sidewalls and metallic via contact are provided with significantly lower resistance than if a TiN barrier layer was in contact with the underlying metal.

FIGS. 2–8 show the pore sealing process of the invention occurring prior to the removal of cap layer 18. This advantageously prevents any chemicals used during the present pore sealing process from reacting with or damaging the underlying lower damascene wiring 46. However, it should be appreciated that wherein the lower damascene wiring 46 is composed of a material that will not be affected by the chemicals used during the present pore sealing process, this cap layer 18 may be removed prior to the pore sealing processing steps of the invention.

Figure 9A:
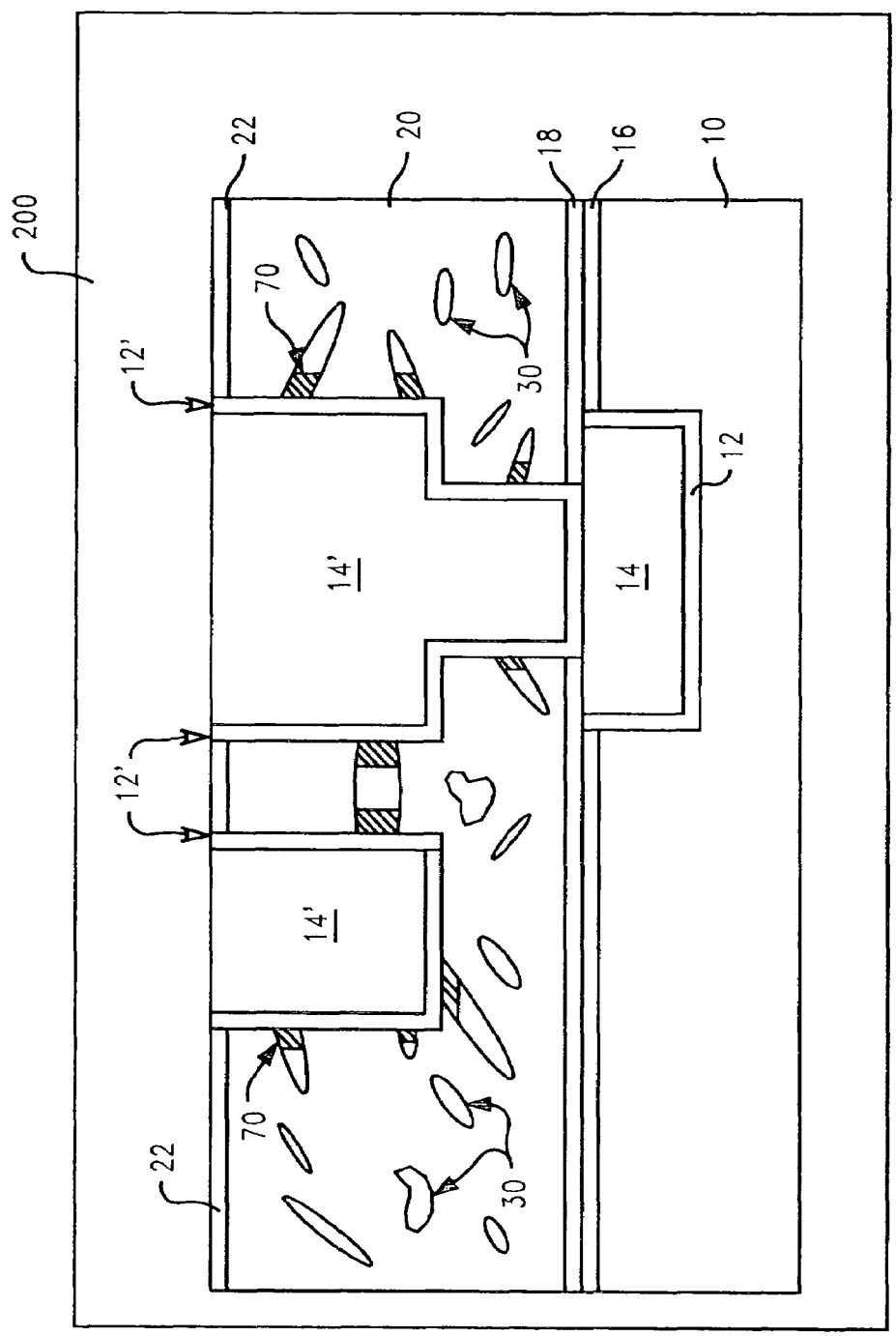
FIG. 9A is a cross-sectional view showing the semiconductor structure of the invention following metallization of the structure of FIG. 6.
Figure 9B:
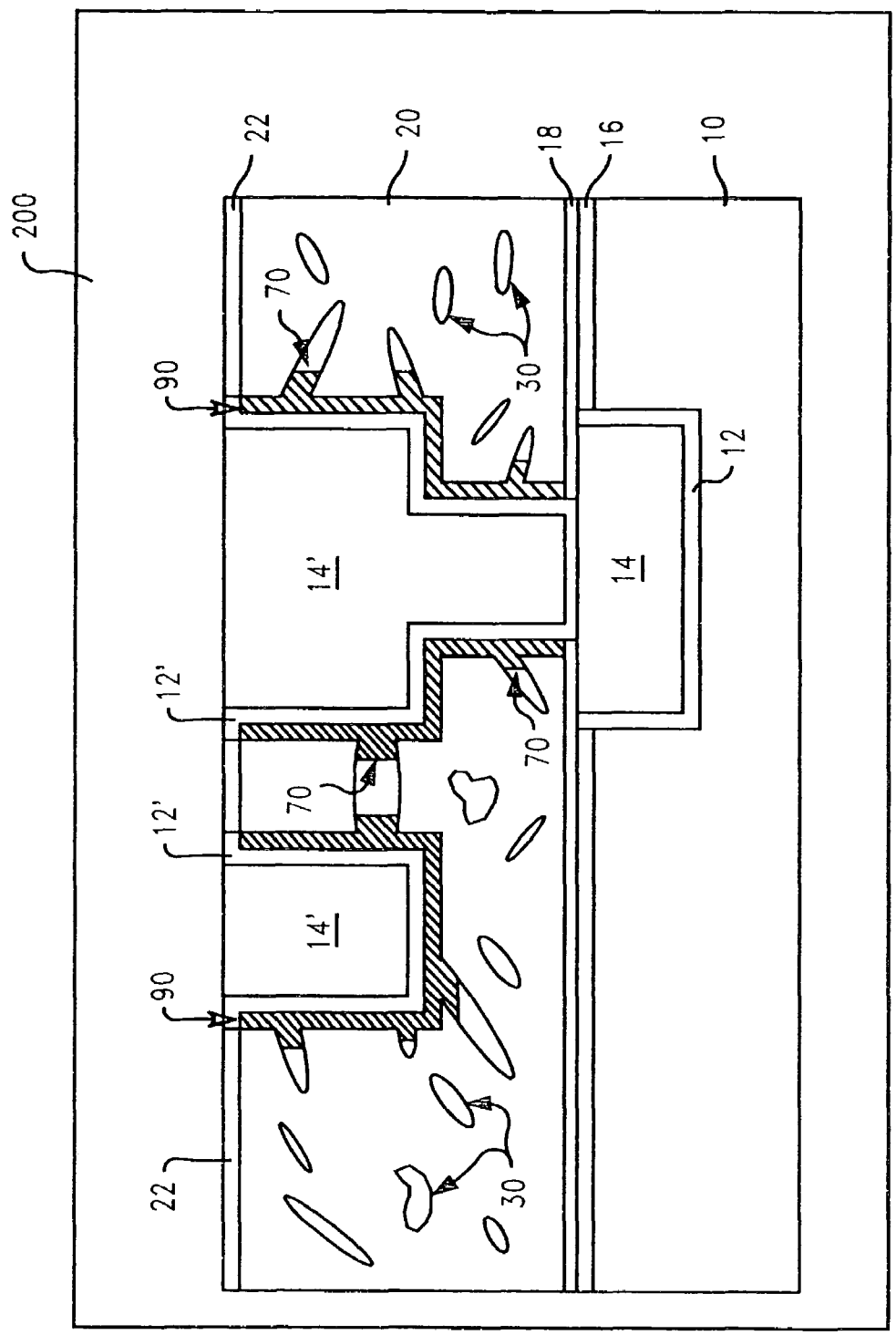
FIG. 9B is a cross-sectional view showing another semiconductor structure of the invention following metallization of the structure of FIG. 8.

Referring to FIGS. 9A–9B, in either event, once the pores 35 are closed via the present pore-closing layer 70 (as shown in FIG. 6), and optionally a bottomless liner layer 90 is formed in addition to the pore-closing layers 70 (as shown in FIG. 8), the resultant structures may be further processed by known metallization steps. In so doing, hard mask layer 24 is removed, and if present, any exposed portions of the cap layer 18 residing within the bottom of via 47 openings are removed by known techniques. Additional barrier/liner layer 12' is conformally deposited within openings 40 such that is coats the sidewalls and bottom surfaces within each of the openings 40. Any remaining empty portions of openings 40 are then filled with additional metallization layer 14', such as, but not limited to damascene copper, tungsten, aluminum and the like. The resultant structures include a metallized semi-conductor structure having the pore sealing layer 70 of the invention (FIG. 9A), and a metallized semiconductor structure having the present invention's bottomless liner 90 in addition to pore sealing layer 70 (FIG. 9B).

While the present invention has been particularly described, in conjunction with a specific preferred embodiment, it is evident that many alternatives, modifications and variations will be apparent to those skilled in the art in light of the foregoing description. It is therefore conplated templated that the appended claims will embrace any such alternatives, modifications and variations as falling within the true scope and spirit of the present invention.

The invention claimed is:

1. A method for closing exposed pores in a porous dielectric layer comprising:
   providing a low-k porous dielectric layer having at least one exposed pore with a first reactant therein;
   providing a second reactant into a mouth region of said at least one exposed pore while simultaneously outgassing said first reactant toward said mouth region;
   generating an in-situ chemical reaction at said mouth region of said at least one exposed pore by contacting said second reactant with said outgassed first reactant; and
   forming a pore-closing layer across said mouth region via said in-situ chemical reaction to transform said at least one exposed pore to at least one closed pore having porosity.

2. The method of claim 1 wherein said low-k porous dielectric layer comprises a dielectric material selected from the group consisting of an organic low-k porous dielectric material, an inorganic low-k porous dielectric material and an organic-inorganic low-k porous dielectric material.

3. The method of claim 1 wherein said low-k porous dielectric layer comprises a patterned low-k porous dielectric layer, said at least one exposed pore residing within an opening of said patterned low-k porous dielectric layer.

4. The method of claim 1 wherein said low-k porous dielectric layer is a spin-on low-k porous dielectric layer, said first reactant comprises residual volatile by-product porogen fragments of said spin-on porous dielectric layer residing within said at least one exposed pore.

5. The method of claim 4 further comprising the steps of:
   generating said in-situ chemical reaction at said mouth region of said at least one exposed pore by contact between said reactant and said outgassed first reactant;
   forming said pore-closing layer across said mouth region via said in-situ chemical reaction to transform said at least one exposed pore to at least one closed pore having porosity; and
   allowing said in-situ chemical reaction occur for a time sufficient to allow said pore-closing layer grow out laterally from said at least one closed pore to form a liner layer on exposed surfaces of said low-k porous dielectric layer.

6. The method of claim 1 wherein said first reactant is provided within said at least one exposed pore by providing said first reactant over said porous dielectric layer for a time sufficient to allow said first reactant absorb within said at least one exposed pore.

7. The method of claim 6 further including removing any residual first reactant molecules provided on said porous dielectric layer prior to providing said second reactant into said mouth region of said at least one exposed pore.

8. The method of claim 6 further comprising the steps of:
   depositing said first reactant over said porous dielectric layer for said time sufficient to allow said first reactant absorb within said at least one exposed pore and adsorb onto exposed surfaces of said low-k porous dielectric layer;
   providing said second reactant into said mouth region of said at least one exposed pore while said first reactant is simultaneously outgassed toward said mouth region;
   contacting said second reactant with said outgassed first reactant at said mouth region;
   contacting said second reactant with said adsorbed first reactant on said exposed surfaces of said low-k porous dielectric layer;
   generating said in-situ chemical reaction at said mouth region by contact between said second reactant and said outgassed first reactant and at said exposed surfaces of said low-k porous dielectric layer by contact between said second reactant and said adsorbed first reactant;
   forming said pore-closing layer across said mouth region via said in-situ chemical reaction to transform said at least one exposed pore to said at least one closed pore having porosity; and
   forming a liner layer on said exposed surfaces of said low-k porous dielectric layer via said in-situ chemical reaction.

9. The method of claim 1 wherein said second reactant is provided into said mouth region of said at least one exposed pore by a chemical vapor deposition process.

10. The method of claim 1 wherein said low-k porous dielectric layer is immersed into a bath solution for providing said second reactant into said mouth region of said at least one exposed pore.

11. The method of claim 1 wherein said first reactant is selected from the group consisting of an oxygen-containing reactant, a carbon-containing reactant, ammonia, and TEOS.

12. The method of claim 1 wherein said second reactant is selected from the group consisting of a silane-containing plasma, a TiN plasma in the absence of any $NH_3$ flow, and an acidic bath solution.

13. The method of claim 1 further including pre-treating said porous dielectric layer to increase hydrophilicity of said at least one exposed pore.

14. The method of claim 1 wherein said pore-closing layer has a thickness ranging from about 2 nm to about 20 nm inside and across said mouth region of said at least one closed pore.

15. A method for closing exposed pores in a porous dielectric layer prior to metallization comprising:
   providing a substrate;
   forming a low-k porous dielectric layer having a plurality of closed pores over said substrate;
   patterning said low-k porous dielectric layer to form openings therein whereby selected ones of said closed pores are transformed to exposed pores within said openings;
   providing a first reactant within said exposed pores in said openings of said low-k porous dielectric layer;
   providing a second reactant into said openings in said low-k porous dielectric layer, said second reactant at least being introduced into a mouth region of each said exposed pore while simultaneously outgassing said first reactant toward said mouth region;
   generating an in-situ chemical reaction at least at said mouth region of each of said exposed pore by contacting said second reactant with said outgassed first reactant; and
   forming a pore-closing layer across said mouth region via said in-situ chemical reaction to transform said exposed pores to closed pores.

16. The method of claim 15 further comprising:
   adsorbing said first reactant onto exposed surfaces of said low-k porous dielectric layer within said openings;

providing said second reactant into said openings;

contacting said second reactant with said outgassed first reactant at said mouth region and with said adsorbed first reactant;

generating said in-situ chemical reaction at said mouth region and at said exposed surfaces of said low-k porous dielectric layer within said openings by contacting said second reactant with said outgassed and adsorbed first reactant; and forming said pore-closing layer across said mouth regions and a bottomless liner layer within said openings on said exposed surfaces of said low-k porous dielectric layer via said in-situ chemical reaction.

17. The method of claim 15 wherein said low-k porous dielectric layer is a spin-on low-k porous dielectric layer, said first reactant comprises residual volatile by-product porogen fragments of said spin-on porous dielectric layer residing within said at least one exposed pore.

18. The method of claim 15 wherein said first reactant is provided within said at least one exposed pore by providing said first reactant over said porous dielectric layer for a time sufficient to allow said first reactant absorb within said at least one exposed pore.

* * * * *